United States Patent
Jia et al.

(10) Patent No.: US 10,896,859 B2
(45) Date of Patent: Jan. 19, 2021

(54) DISPLAY SUBSTRATE, METHOD FOR FORMING DISPLAY SUBSTRATE AND METHOD FOR DETECTING THE SAME

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Dongwang Jia, Beijing (CN); Jia Meng, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 46 days.

(21) Appl. No.: 16/255,323

(22) Filed: Jan. 23, 2019

(65) Prior Publication Data

US 2019/0363028 A1    Nov. 28, 2019

(30) Foreign Application Priority Data

May 23, 2018  (CN) .......................... 2018 1 0527434

(51) Int. Cl.
*H01L 21/66*       (2006.01)
*G01R 27/02*       (2006.01)
(Continued)

(52) U.S. Cl.
CPC .............. *H01L 22/32* (2013.01); *G01R 27/02* (2013.01); *G01R 31/2825* (2013.01);
(Continued)

(58) Field of Classification Search
None
See application file for complete search history.

(56) References Cited

U.S. PATENT DOCUMENTS 5,986,739 A * 11/1999 Kobayashi ............ G02F 1/1309
                                                    349/143
2004/0032553 A1    2/2004 Hong
(Continued)

FOREIGN PATENT DOCUMENTS

CN          1475853 A       2/2004
CN        104733478 A       6/2015
(Continued)

OTHER PUBLICATIONS

First Office Action for Chinese Application No. 201810527434.5, dated Mar. 24, 2020, 6 Pages.

*Primary Examiner* — Jas A Sanghera
(74) *Attorney, Agent, or Firm* — Brooks Kushman P.C.

(57) ABSTRACT

A display substrate, a method for forming a display substrate and a method for detecting the same are provided. The display substrate includes a base substrate. The base substrate includes a display region and a non-display region at a periphery of the display region, the non-display region includes a wiring region, the wiring region includes a plurality of signal lines on the base substrate. The display substrate further includes an insulation layer covering the plurality of signal lines and at least one conductive pattern on a surface of the insulation layer away from the signal lines, each of the at least one conductive pattern includes at least one conductive line segment, an orthographic projection of each of the signal lines onto the base substrate is within an orthographic projection of a corresponding conductive line segment of the at least one conductive line segment onto the base substrate.

16 Claims, 6 Drawing Sheets

(51) Int. Cl.
  *G01R 31/28* (2006.01)
  *G02F 1/1343* (2006.01)
  *G02F 1/1362* (2006.01)
  *H01L 27/12* (2006.01)

(52) U.S. Cl.
  CPC .... *G02F 1/13439* (2013.01); *G02F 1/136286* (2013.01); *H01L 27/124* (2013.01); *H01L 27/1259* (2013.01); *G02F 2001/136254* (2013.01); *G02F 2001/136295* (2013.01); *G02F 2201/121* (2013.01); *G02F 2201/123* (2013.01)

(56) References Cited

U.S. PATENT DOCUMENTS

| | | | |
|---|---|---|---|
| 2011/0080549 A1* | 4/2011 | Jung | G02F 1/1345 349/141 |
| 2015/0309381 A1* | 10/2015 | Cai | H01L 27/1244 257/749 |
| 2017/0271368 A1 | 9/2017 | Zhang et al. | |
| 2017/0301272 A1* | 10/2017 | Jeon | G01R 27/02 |

FOREIGN PATENT DOCUMENTS

| | | |
|---|---|---|
| CN | 105575961 A | 5/2016 |
| CN | 107065339 A | 8/2017 |

\* cited by examiner

DISPLAY SUBSTRATE, METHOD FOR FORMING DISPLAY SUBSTRATE AND METHOD FOR DETECTING THE SAME

CROSS-REFERENCE TO RELATED APPLICATION

This application claims priority to Chinese Patent Application No. 201810527434.5 filed on May 23, 2018, which is incorporated herein by reference in its entirety.

TECHNICAL FIELD

The present disclosure relates to the field of display technology, and in particular to a display substrate, a method for forming a display substrate and a method for detecting the same.

BACKGROUND

When cutting the substrate or panel of the thin film transistor display device in the related art, the signal line at the peripheral wiring region is easily scratched or broken due to the longitudinal and lateral pressure of the cutter wheel, which may result in a defective signal line. If such fracture is not complete, the fractured portion may be further etched or fractured.

At present, there is no effective ways to detect whether the signal line of the wiring region is fractured or whether there is a risk of fracture, which seriously affects the yield of the displayed product.

SUMMARY

A display substrate is provided in the present disclosure, including a base substrate, where the base substrate includes a display region and a non-display region at a periphery of the display region, the non-display region includes a wiring region, the wiring region includes a plurality of signal lines on the base substrate, where the display substrate further includes an insulation layer covering the plurality of signal lines and at least one conductive pattern on a surface of the insulation layer away from the signal lines, each of the at least one conductive pattern includes at least one conductive line segment, an orthographic projection of each of the signal lines onto the base substrate is within an orthographic projection of a corresponding conductive line segment of the at least one conductive line segment onto the base substrate.

Optionally, positions of the signal lines and positions of the at least one conductive line segment are in one-to-one correspondence.

Optionally, each of the signal lines is approximately parallel with the corresponding conductive line segment.

Optionally, the at least one conductive pattern each includes a plurality of conductive line segments.

Optionally, the at least one conductive pattern each includes a plurality of connection lines, the plurality of conductive line segments of each of the at least one conductive pattern are in parallel, and centers of the plurality of conductive line segments of each of the at least one conductive pattern are on the same straight line, and the plurality of conductive line segments of each of the at least one conductive pattern are connected end to end through the connection lines.

Optionally, the at least one conductive pattern each includes one conductive line segment.

Optionally, the wiring region includes a plurality of sub wiring regions, and each of the sub wiring regions includes at least one conductive pattern.

Optionally, the non-display region further includes a detection region, and two ends of each of the at least one conductive pattern are at the detection region and configured to be in contact with external probes.

Optionally, the display region of the display substrate includes a pixel electrode, and the at least one conductive pattern and the pixel electrode are at the same layer.

Optionally, the display region of the display substrate includes a common electrode, and the at least one conductive pattern and the common electrode are at the same layer.

Optionally, the connection lines at a first side of the plurality of conductive line segments are on a first straight line, the connection lines at a second side of the plurality of conductive line segments opposite to the first side are on a second straight line, and the first straight line is in parallel to the second straight line.

Optionally, the wiring region includes a plurality of sub wiring regions, the display substrate includes a plurality of conductive patterns at the plurality of sub wiring regions respectively.

Optionally, two ends of the conductive patterns in an identical sub wiring region are at the same side of the identical sub wiring region.

Optionally, two ends of the conductive patterns in an identical sub wiring region are at two opposite sides of the identical sub wiring region.

Optionally, the conductive patterns at the plurality of sub wiring regions respectively are axisymmetric.

A method for forming a display substrate is further provided in the present disclosure, where the display substrate includes a base substrate, the base substrate includes a display region and a non-display region at a periphery of the display region, and the non-display region includes a wiring region, where the method includes:

forming a plurality of signal lines at the wiring region of the base substrate;

forming an insulation layer covering the plurality of signal lines; and forming at least one conductive pattern on a surface of the insulation layer away from the signal lines, where each of the at least one conductive pattern includes at least one conductive line segment, positions of the signal lines and positions of the at least one conductive line segment are in one-to-one correspondence, and an orthographic projection of each of the signal lines onto the base substrate is within an orthographic projection of a corresponding conductive line segment of the at least one conductive line segment onto the base substrate.

Optionally, the method further includes: forming a transparent conductive film on a surface of the insulation layer away from the signal lines, and patterning the transparent conductive film to form the at least one conductive pattern and a pixel electrode at the display region.

Optionally, the method further includes: forming a transparent conductive film on a surface of the insulation layer away from the signal lines, and patterning the transparent conductive film to form the at least one conductive pattern and a common electrode at the display region.

A method for detecting the above display substrate is further provided in the present disclosure, including:

applying a voltage onto two ends of each of the at least one conductive pattern, to obtain a resistance of each of the at least one conductive pattern;

in a case that the resistance of a conductive pattern of the at least one conductive pattern is smaller than a threshold, determining that the signal line at a position corresponding to the at least one conductive line segment of the conductive pattern is intact; or in a case that the resistance of a conductive pattern of the at least one conductive pattern is larger than a threshold, determining a broken conductive line segment of the conductive pattern, and detecting whether the signal line at a position corresponding to the broken conductive line segment is broken.

Optionally, the non-display region further includes a detection region, and two ends of each of the at least one conductive pattern are at the detection region, the method further includes: enabling two probes to be in contact with the two ends of each of the at least one conductive pattern respectively, to apply a voltage onto the two ends of each of the at least one conductive pattern.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

Figure 1:
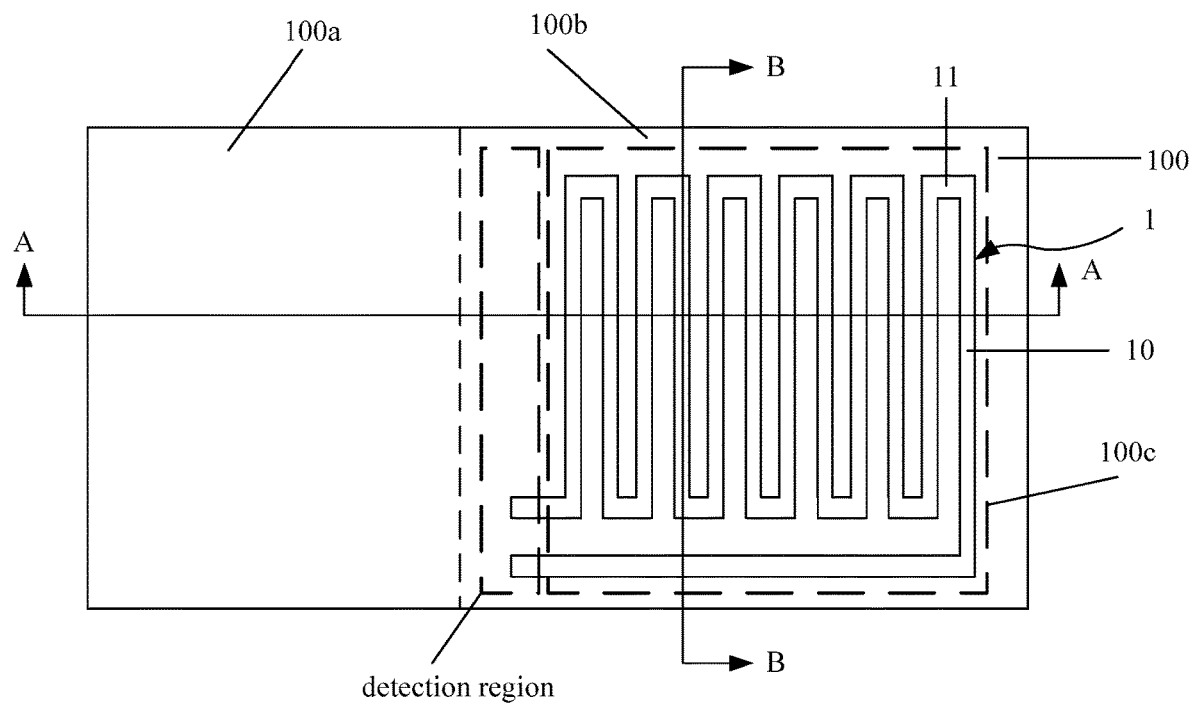
FIG. 1 is a schematic view of a display substrate in some embodiments of the present disclosure.

A display substrate is provided in some embodiments of the present disclosure, to detect whether a signal line at a peripheral wiring region is fractured or whether there is a risk of fracture of the signal line at the peripheral wiring region.

A display substrate includes a base substrate. The base substrate includes a display region and a non-display region arranged at a periphery of the display region, the non-display region includes a wiring region, the wiring region includes a plurality of signal lines arranged on the base substrate and configured to transmit a signal required for display to the display region.

The display substrate further includes an insulation layer covering the plurality of signal lines and at least one conductive pattern arranged on a surface of the insulation layer away from the signal lines. Each of the at least one conductive pattern includes at least one conductive line segment. Positons of the signal lines and positions of the at least one conductive line segment are in one-to-one correspondence. An orthographic projection of each of the signal lines onto the base substrate is within an orthographic projection of a corresponding conductive line segment of the at least one conductive line segment onto the base substrate.

According to the above display substrate, the conductive pattern is arranged at the side of the signal line away from the base substrate, therefore, if the cutting process causes scratches or breaks on the signal line, it will inevitably cause more serious damage to the conductive pattern at the side of the signal line away from the base substrate. By detecting whether the conductive pattern is fractured or has a risk of fracture, it is able to check whether the signal line is fractured or has a risk of fracture, so the detection efficiency is high. The conductive pattern includes at least one conductive line segment, each conductive line segment is arranged at a position corresponding to at least one signal line, so in a case that the conductive pattern is fractured or has a risk of fracture, it is able to determine a fractured position of the signal line or a position of the signal line having a risk of fracture according to the fractured position of the conductive line segment of the conductive pattern, so the detection accuracy is high.

The conductive line segment may be arranged corresponding to the position of the at least two signal lines, or may be in one-to-one correspondence with the position of the signal line.

In some embodiments of the present disclosure, positions of the signal lines are in a one-to-one correspondence to the positions of the conductive line segments, that is, the orthographic projection of each signal line onto the plane of the display substrate is within the orthographic projection of the corresponding conductive line segment onto the plane of the display substrate, so it is possible to accurately find out which signal line is fractured or has a risk of fracture.

In some embodiments of the present disclosure, the signal line are in parallel to the corresponding conductive line segment, it is able to effectively detect the risk of fracture or the fracture at any position of the signal line. The signal line may be of a straight line structure extending in one direction, or may be of a zigzag line or a curved line structure.

In order to achieve effective detection of the signal lines and simplify the structure of the conductive pattern, the shape and length of the conductive line segment are the same with the shape and length of the corresponding signal line, and the two are arranged in parallel to each other.

In some embodiments of the present disclosure, the plurality of signal lines at the wiring region is of a straight line structure and arranged in parallel to each other. As shown in FIG. 1, each conductive pattern 1 includes a plurality of (two or more) conductive line segments 10, the plurality of conductive line segments 10 are arranged in parallel to each other. The centers of the conductive line segments of each conductive pattern 1 are arranged on the same straight line, and the plurality of conductive line segments 10 are connected end to end through the connection lines 11 to form a serpentine pattern. By obtaining an actual resistance value of the conductive pattern through two ends of the conductive pattern and comparing the obtained resistance value with a preset resistance value (the resistance value in a case that the conductive pattern is not scratched or fractured), if the actual resistance value is smaller than or basically the same with a threshold, it may be determined that there is no risk of fracture or fracture of the signal line corresponding to all the conductive line segments of the conductive pattern. If the actual resistance value is larger than the threshold, since the resistance of the corresponding conductive pattern may increase due to scratch or break of the conductive line segment, it may be determined that there is a risk of fracture or a fracture of the signal line corresponding to the position of one or more conductive segments of the conductive pattern. Then, the fractured position of the signal line or the position of the signal line has a risk of fracture may be determined based on the fractured position of the conductive pattern.

According to the above display substrate, by the serpentine conductive pattern, it is able to detect simultaneously whether a plurality of signal lines are fractured or have a risk of fracture through one conductive pattern, and only when there is a risk of fracture, the fractured position of the signal line or the position of the signal line has a risk of fracture may be determined based on the fractured position of the conductive line segment of the conductive pattern, thereby improving the detection efficiency.

In some embodiments of the present disclosure, the positions of the conductive line segments are in a one-to-one correspondence to the positions of the signal lines. When it is determined that signal line is fractured or has a risk of fracture based on the resistance value of the conductive pattern, it is able to determine, based on the fractured position of the conductive line segment of the conductive pattern, which signal line is fractured or has a risk of fracture and the fractured position of the signal line or the position of the signal line has a risk of fracture, thereby improving the detection efficiency.

Of course, the shapes and length of the signal lines may be varied with the position of the wiring region, and therefore the conductive pattern is not limited to the above-described serpentine pattern.

In some embodiments of the present disclosure, the display substrate may be configured to have at least two conductive patterns or only one conductive pattern, and the conductive pattern includes a plurality of conductive line segments. Specifically, the number of conductive patterns may be determined based on the position of the conductive pattern, which has a high flexibility.

Each conductive pattern may include at least two conductive line segments or only one conductive line segment.

In some embodiments of the present disclosure, the wiring region of the display substrate may be divided as needed, the wiring region includes a plurality of sub wiring regions, each of the wiring regions is provided with the conductive pattern, so as to detect the wiring region by regions and improve the detection precision. For example, the wiring region is divided into two sub wiring regions at the upper and lower sides respectively, or two sub wiring regions at the left and right sides respectively, or four sub wiring regions at the upper, lower, left and right sides respectively. The areas and shapes of different sub wiring regions may be the same or different. Each sub wiring region may be provided with at least two separate patterns or only one conductive pattern, and each conductive pattern may include at least two conductive line segments or only one conductive line segment, which is designed based on the shape of the signal line and wirings.

In order to obtain the resistance of the conductive pattern, the non-display region further includes a detection region, and both ends of each of the conductive patterns are arranged in a detection region for a contact connection with an external probe, and the resistance of the conductive pattern is obtained through the probes.

In some embodiments of the present disclosure, in a case that the display substrate is a liquid crystal display substrate, the display substrate includes a pixel electrode, and the conductive pattern and the pixel electrode of the display substrate may be arranged at the same layer and made of the same transparent conductive film, thereby simplifying the forming process.

When the display substrate further includes a common electrode, the conductive pattern and the common electrode of the display substrate may be arranged at the same layer and made of the same transparent conductive film, thereby simplifying the forming process.

In some embodiments of the present disclosure, the display substrate may be a liquid crystal display substrate, an organic light-emitting diode display substrate or the like. For example, in a case that the display substrate is an organic light-emitting diode display substrate, the conductive pattern and the cathode or the anode of the organic light-emitting diode may be arranged at the same layer and made of the same transparent conductive film, thereby simplifying the forming process.

A method for forming a display substrate is further provided in some embodiments of the present disclosure, the display substrate includes a base substrate, the base substrate includes a display region and a non-display region arranged at a periphery of the display region, and the non-display region includes a wiring region, the method includes:

forming a plurality of signal lines at the wiring region of the base substrate;

forming an insulation layer covering the plurality of signal lines; and forming at least one conductive pattern on a surface of the insulation layer away from the signal lines, where each of the at least one conductive pattern includes at least one conductive line segment, positions of the signal lines and positions of the at least one conductive line segment are in one-to-one correspondence, and an orthographic projection of each of the signal lines onto the base substrate is within an orthographic projection of a corresponding conductive line segment of the at least one conductive line segment onto the base substrate.

According to the above method, the conductive pattern is arranged at the side of the signal line away from the base substrate, therefore, if the cutting process causes scratches or breaks on the signal line, it will inevitably cause more serious damage to the conductive pattern at the side of the signal line away from the base substrate. By detecting whether the conductive pattern is fractured or has a risk of fracture, it is able to check whether the signal line is fractured or has a risk of fracture, so the detection efficiency is high. The conductive pattern includes at least one conductive line segment, each conductive line segment is arranged at a position corresponding to at least one signal line, so in a case that the conductive pattern is fractured or has a risk of fracture, it is able to determine a fractured position of the signal line or a position of the signal line having a risk of fracture according to the fractured position of the conductive line segment of the conductive pattern, so the detection accuracy is high.

When the display substrate includes a pixel electrode, the method further includes:

forming a transparent conductive film on a surface of the insulation layer away from the signal lines, and patterning the transparent conductive film to form the at least one conductive pattern and a pixel electrode arranged at the display region.

When the display substrate includes a common electrode, the method further includes:

forming a transparent conductive film on a surface of the insulation layer away from the signal lines, and patterning the transparent conductive film to form the at least one conductive pattern and a common electrode arranged at the display region.

The conductive pattern is formed with the pixel electrode or the common electrode without adding a new patterning process, thereby simplifying the forming process and reducing the production cost.

A method for detecting the display substrate hereinabove is further provided in some embodiments of the present disclosure, including:

applying a voltage onto two ends of each of the at least one conductive pattern, to obtain a resistance of each of the at least one conductive pattern; in a case that the resistance of a conductive pattern of the at least one conductive pattern is smaller than a threshold, determining that the signal line at a position corresponding to the at least one conductive line segment of the conductive pattern is intact; or in a case that the resistance of a conductive pattern of the at least one conductive pattern is larger than a threshold, determining a broken conductive line segment of the conductive pattern, and detecting whether the signal line at a position corresponding to the broken conductive line segment is broken.

According to the above method, firstly, the actual resistance value of each conductive pattern is obtained, and only when the actual resistance value of conductive pattern is larger than a threshold, the signal line corresponding to the conductive pattern will be checked whether it is broken (fractured or has a risk of fracture), which has a detection efficiency. By checking the fractured position of the conductive line segment of the conductive pattern, it is able to determine that the signal line corresponding to the conductive line segment is fractured or has the risk of fracture, which has high detection accuracy.

In order to obtain the resistance of the conductive pattern, the non-display region further includes a detection region, and both ends of each of the conductive patterns are arranged in a detection region for a contact connection with an external probe, and the resistance of the conductive pattern is obtained through the probes.

The present disclosure will be described hereinafter in conjunction with the drawings and embodiments. The following embodiments are for illustrative purposes only, but shall not be used to limit the scope of the present disclosure.

Next, a thin film transistor display substrate is taken as an example to specifically describe the embodiments of the present disclosure.

Figure 2:
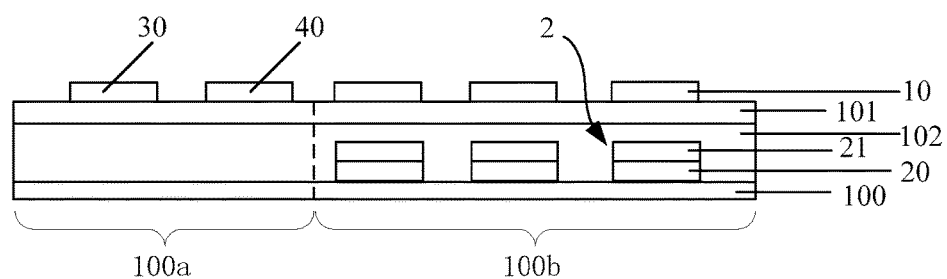
FIG. 2 is a cross-sectional view taken along line A-A of FIG. 1.
Figure 3:
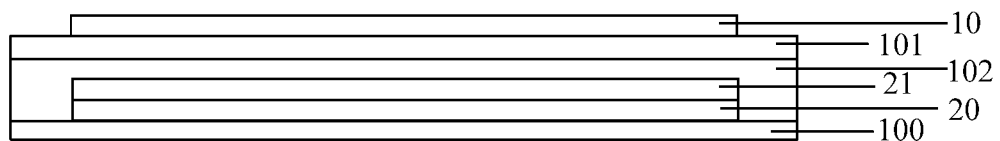
FIG. 3 is a cross-sectional view taken along line B-B of FIG. 1.

As shown in FIGS. 1-3, the display substrate includes a base substrate 100 including a display region 100a and a non-display region 100b arranged at a periphery of the display region 100a, the non-display region 100b includes a wiring region 100c, and the wiring region 100c includes a plurality of signal lines 2 arranged on the base substrate 100 and configured to transmit signals required for the display to the display region 100a.

The display region includes a plurality of pixel areas, each of the pixel areas includes a thin film transistor and a pixel electrode, and the thin film transistor includes a gate electrode, a source electrode, a drain electrode and an active layer, the gate electrode is made of a gate metal layer, the source and drain electrodes are made of a source/drain metal layer. The thin film transistor may be a bottom-gate type thin film transistor, a top-gate type thin film transistor or a coplanar thin film transistor. In the embodiment, a top-gate type thin film transistor is taken as an example to specifically describe the technical solution of the present disclosure.

The gate metal layer and the source/drain metal layer may be a metal such as Cu, Al, Ag, Mo, Cr, Nd, Ni, Mn, Ti, Ta, W, or an alloy of these metals, and may be of a single layer structure or a multilayer structure, the multilayer structure may be as Cu\Mo, Ti\Cu\Ti, Mo\Al\Mo, etc.

In some embodiments, the source/drain metal layer is a composite layer structure of Al\Nd, and the gate metal layer is a Mo metal layer.

The signal line 2 of the wiring region includes a first signal line 20 and a second signal line 21 arranged on and being in contact with a surface of the first signal line away from the base substrate 100, that is, the signal line 2 is of a composite layer structure, which may reduce the transmission resistance of signal line 2 and reduce the IR Drop. The first signal line 20 may be formed at the same layer with the source electrode and the drain electrode of the thin film transistor by patterning the same source/drain metal layer, and the second signal line 21 may be formed at the same layer with the gate electrode of the thin film transistor by patterning the same gate metal layer.

The display substrate further includes a gate insulation layer 102 covering the signal line 2 and the gate electrode, and an insulation layer 101 covering the gate insulation layer 102. The gate insulation layer 102 and the insulation layer 101 may be of a single layer structure or a composite layer structure made of an insulating material such as silicon nitride, silicon oxide or silicon oxynitride. In some embodiments of the present disclosure, the insulation layer 101 may serve as a passivation layer.

As shown in FIG. 2, in some embodiments of the present disclosure, the display substrate is a liquid crystal display substrate and further includes a pixel electrode 30, and the conductive pattern 1 (i.e., the conductive line segments 10 and the connection lines 11) and the pixel electrode 30 of the display substrate are arranged at the same layer and made of the same transparent conductive film.

As shown in FIG. 2, in some embodiments of the present disclosure, the display substrate is a liquid crystal display substrate and further includes a common electrode 40, and the conductive pattern 1 (i.e., the conductive line segments 10 and the connection lines 11) and the common electrode 40 of the display substrate are arranged at the same layer and made of the same transparent conductive film.

The conductive pattern 1 is arranged on the surface of the insulation layer 101 away from the signal line 2, and the conductive pattern 1 includes a plurality of conductive line segments 10 with an equal length and arranged in parallel, and the centers of the plurality of conductive segments 10 are arranged on the same straight line. The conductive segments 10 are connected end to end through the connection lines 11 to form a serpentine pattern. The connection lines 11 may be integrated with the conductive line segments 10.

Figure 4:
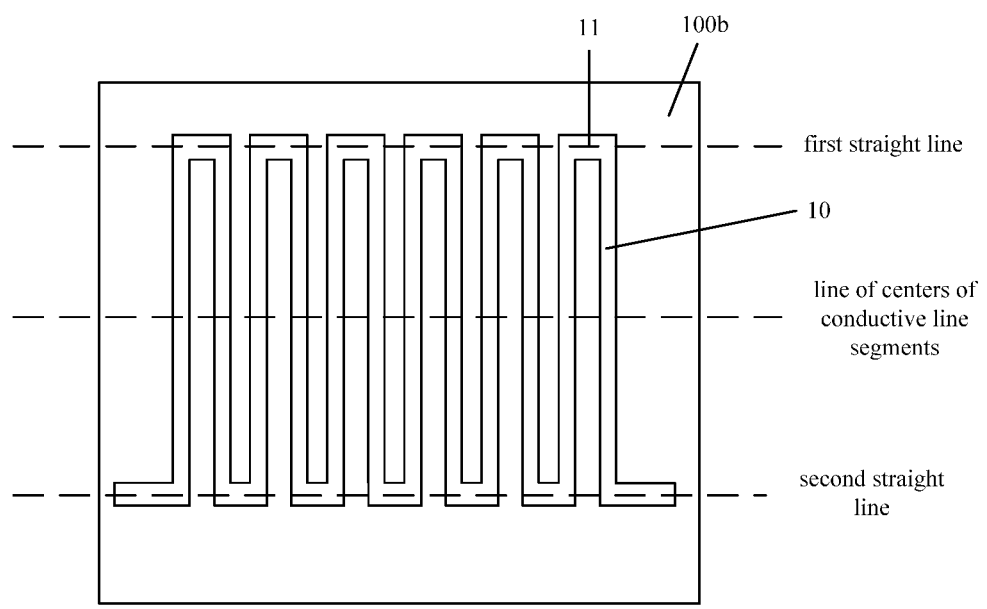
FIG. 4 is a schematic view of a display substrate in some embodiments of the present disclosure.

As shown in FIG. 4, centers of the plurality of conductive line segments 10 of the conductive pattern are arranged on the same straight line.

The conductive segments 10 are in one-to-one correspondence to the positions of the signal lines 2, and the orthographic projection of each of the signal lines 2 onto the plane of the base substrate 100 is arranged within the orthographic projection of the corresponding one of the conductive segments 10 onto the plane of the base substrate 100. By the serpentine conductive pattern, it is able to detect simultaneously whether a plurality of signal lines are fractured or have a risk of fracture through one conductive pattern, and only when there is a risk of fracture, the fractured position of the signal line or the position of the signal line has a risk of fracture may be determined based on the fractured position of the conductive line segment of the conductive pattern, thereby improving the detection efficiency. In some embodiments of the present disclosure, the positions of the conductive line segments are in a one-to-one correspondence to the positions of the signal lines. When it is determined that signal line is fractured or has a risk of fracture based on the resistance value of the conductive pattern, it is able to determine, based on the fractured position of the conductive line segment of the conductive pattern, which signal line is fractured or has a risk of fracture and the fractured position of the signal line or the position of the signal line has a risk of fracture, thereby improving the detection efficiency.

Two ends of the conductive pattern 1 may be arranged at the same side relative to the center of the conductive pattern 1, as shown in FIG. 1, or may be arranged at different sides relative to the center of the conductive pattern 1, as shown in FIG. 4.

As shown in FIG. 4, the connection lines 11 at a first side of the plurality of conductive line segments 10 are on a first straight line, the connection lines 11 at a second side of the plurality of conductive line segments 10 opposite to the first side are on a second straight line, and the first straight line is in parallel to the second straight line.

In a practical application, each of the conductive patterns 1 includes a plurality of conductive segments 10, thereby realizing a detection of a plurality of signal lines 2.

Figure 5:
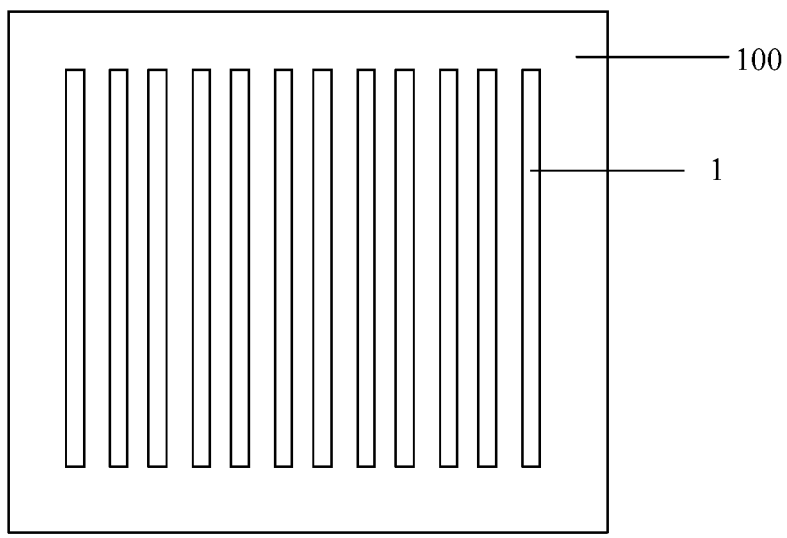
FIG. 5 is a schematic view of a display substrate in some embodiments of the present disclosure.

In a practical application, each conductive pattern 1 may include only one conductive line segment, as shown in FIG. 5.

Figure 8:
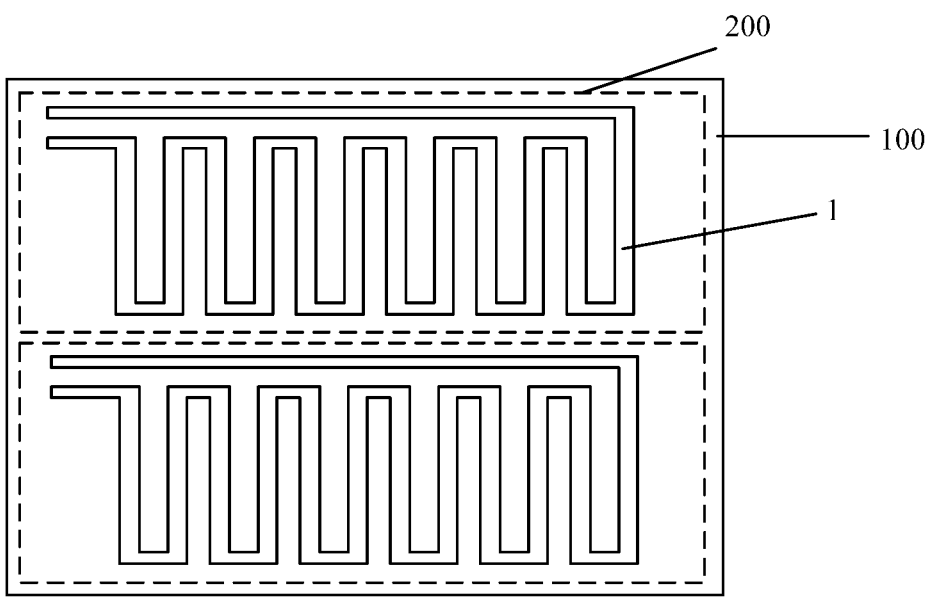
FIG. 8 is a schematic view of a display substrate in some embodiments of the present disclosure.
Figure 9:
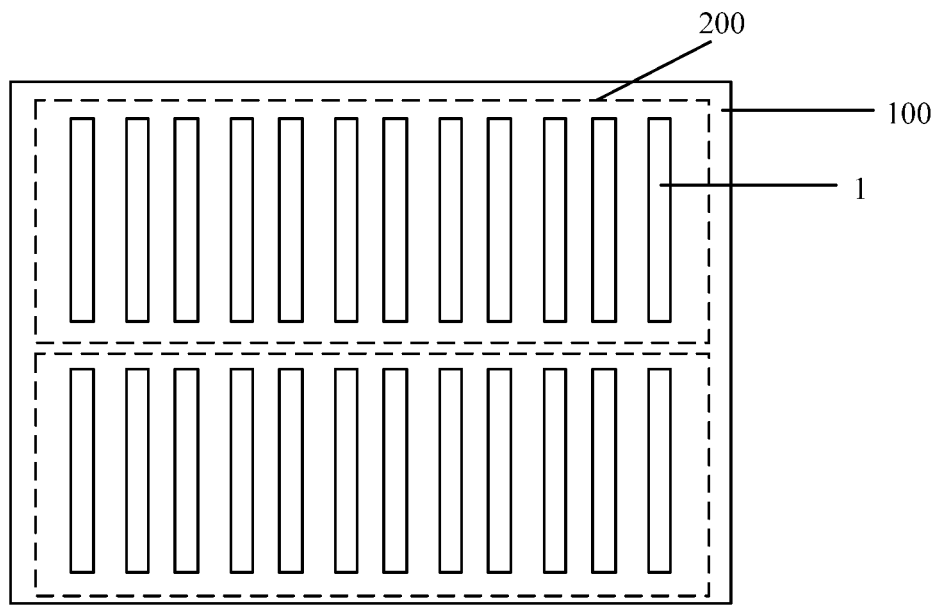
FIG. 9 is a schematic view of a display substrate in some embodiments of the present disclosure.

Of course, the wiring region may also be divided as needed, and the wiring region includes at least two sub wiring regions 200, each of which is provided with at least one conductive pattern. For example, in FIG. 6 and FIG. 7, the wiring region is divided into four sub wiring regions 200. In FIG. 8 and FIG. 9, the wiring region is divided into upper and lower sub wiring regions 200, and in FIG. 10 and FIG. 11, the wiring region is divided into left and right sub wiring regions 200. The areas and shapes of the different sub wiring regions 200 may be the same or not the same.

Figure 6:
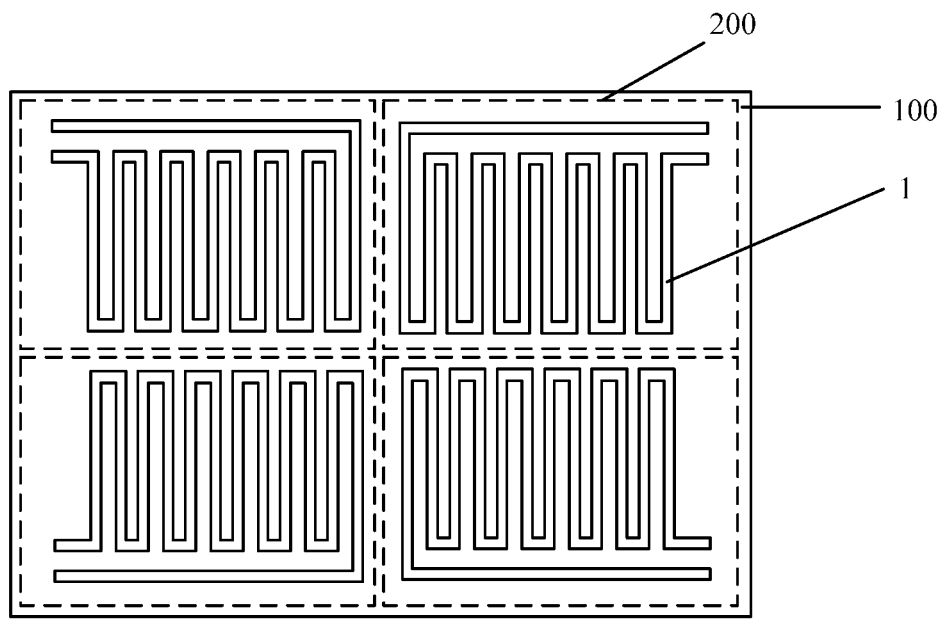
FIG. 6 is a schematic view of a display substrate in some embodiments of the present disclosure.
Figure 7:
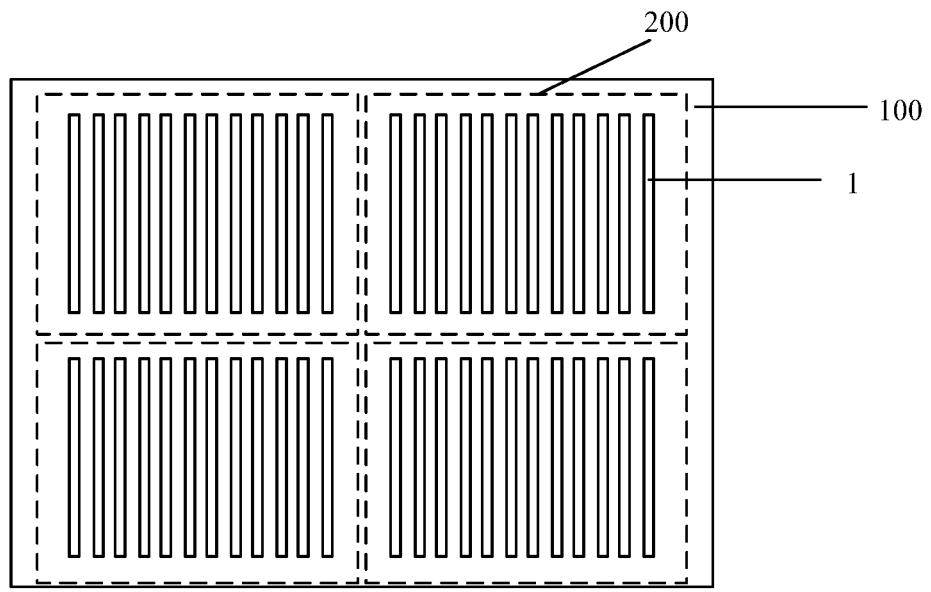
FIG. 7 is a schematic view of a display substrate in some embodiments of the present disclosure.
Figure 11:
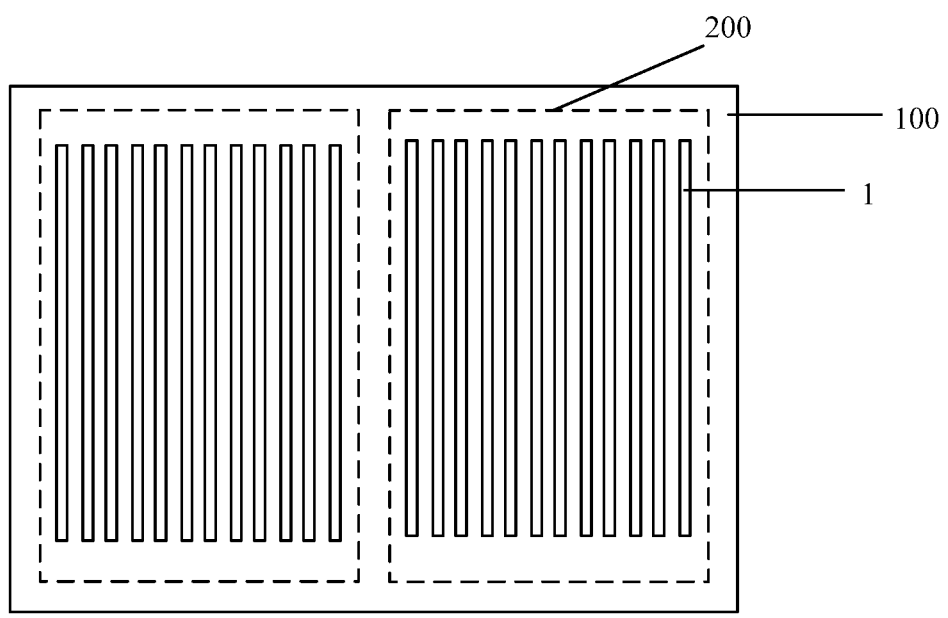
FIG. 11 is a schematic view of a display substrate in some embodiments of the present disclosure.

Each sub wiring region 200 may include at least one conductive pattern 1, as shown in FIGS. 7, 9 and 11. Each conductive pattern 1 may include at least two conductive segments 10, as shown in FIGS. 6 and 8. Each sub-region 200 may include only one conductive pattern 1, as shown in FIGS. 5, 7, 9 and 11, which is designed based on the shape of the signal line and wirings.

In some embodiments of the present disclosure, the wiring region includes a plurality of sub wiring regions, and the display substrate includes a plurality of conductive patterns at the plurality of sub wiring regions respectively.

For example, as shown in FIG. 6, the wiring region 100c includes a plurality of sub wiring regions 200, and the display substrate includes a plurality of conductive patterns 1 at the plurality of sub wiring regions 200 respectively.

In some embodiments of the present disclosure, two ends of the conductive patterns in an identical sub wiring region are at the same side of the identical sub wiring region.

Figure 10:
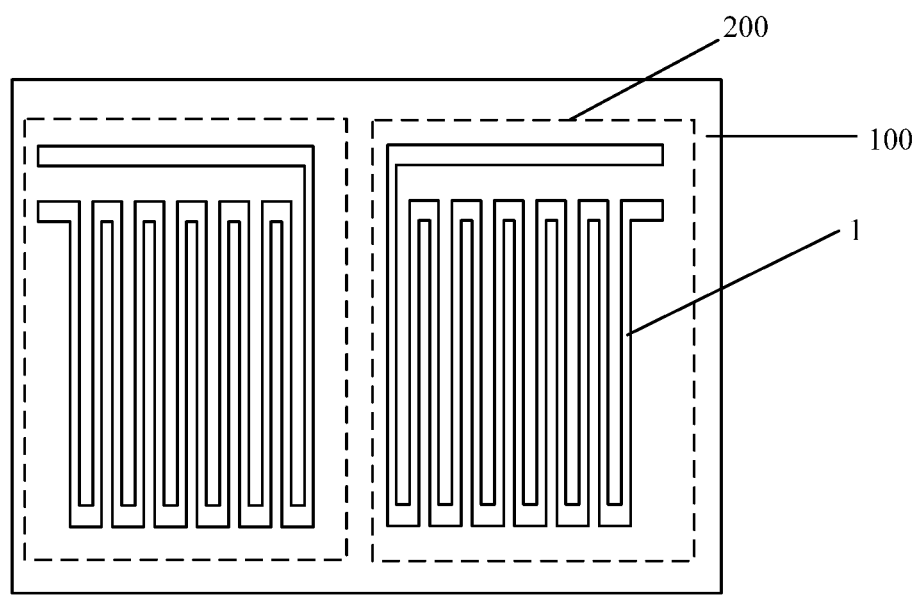
FIG. 10 is a schematic view of a display substrate in some embodiments of the present disclosure.

For example, as shown in FIGS. 6, 8 and 10, two ends of the conductive patterns in an identical sub wiring region 200 are at the same side of the identical sub wiring region.

In some embodiments of the present disclosure, two ends of the conductive patterns 1 in an identical sub wiring region are at two opposite sides of the identical sub wiring region.

For example, as shown in FIGS. 7, 9 and 11, two ends of the conductive patterns 1 in an identical sub wiring region 200 are at two opposite sides of the identical sub wiring region 200.

In some embodiments of the present disclosure, the conductive patterns arranged at the plurality of sub wiring regions respectively are axisymmetric.

For example, as shown in FIGS. 6, 7, 9, 10 and 11, the conductive patterns 1 arranged at the plurality of sub wiring regions 200 respectively are axisymmetric.

In some embodiments of the present disclosure, each conductive pattern 1 includes a plurality of conductive line segments 10, and two ends of the conductive pattern are arranged at the detection region for a contact connection with an external probe to obtain the resistance of the conductive pattern, and multiple signal lines may be detected through one conductive pattern.

For example, as shown in FIG. 1, two ends of the conductive pattern 1 are arranged at the detection region on the left of the wiring region 100c for a contact connection with an external probe to obtain the resistance of the conductive pattern, and multiple signal lines may be detected through one conductive pattern.

As shown in FIG. 1, a method for detecting the above display substrate includes:

applying a voltage onto two ends of each of the conductive pattern 1, to obtain a resistance of the conductive pattern 1 through probes;

in a case that the resistance of the conductive pattern 1 is smaller than a threshold, determining that the signal line at a position corresponding to the conductive line segment 10 of the conductive pattern 1 is intact; or in a case that the resistance of the conductive pattern 1 is larger than a threshold, determining a broken conductive line segment of the conductive pattern 1, and detecting whether the signal line at a position corresponding to the broken conductive line segment is broken.

The above are merely some embodiments of the present disclosure. A person skilled in the art may make further modifications and improvements without departing from the principle of the present disclosure, and these modifications and improvements shall also fall within the scope of the present disclosure.

What is claimed is:

1. A display substrate, comprising a base substrate, wherein the base substrate comprises a display region and a non-display region at a periphery of the display region, the non-display region comprises a wiring region, the wiring region comprises a plurality of signal lines on the base substrate, wherein the display substrate further comprises an insulation layer covering the plurality of signal lines and at least one conductive pattern on a surface of the insulation layer away from the signal lines, each of the at least one conductive pattern comprises at least one conductive line segment, an orthographic projection of each of the signal lines onto the base substrate is within an orthographic projection of a corresponding conductive line segment of the at least one conductive line segment onto the base substrate, wherein positions of the signal lines and positions of the at least one conductive line segment are in one-to-one correspondence, each of the signal lines is approximately parallel with the corresponding conductive line segment, the at least one conductive pattern each comprises a plurality of conductive line segments, the at least one conductive pattern each comprises a plurality of connection lines, the plurality of conductive line segments of each of the at least one conductive pattern are in parallel, and centers of the plurality of conductive line segments of each of the at least one conductive pattern are on the same straight line, and the plurality of conductive line segments of each of the at least one conductive pattern are connected end to end through the connection lines.

2. The display substrate according to claim 1, wherein the at least one conductive pattern each comprises one conductive line segment.

3. The display substrate according to claim 1, wherein the wiring region comprises a plurality of sub wiring regions, and each of the sub wiring regions comprises at least one conductive pattern.

4. The display substrate according to claim 1, wherein the non-display region further comprises a detection region, and two ends of each of the at least one conductive pattern are at the detection region and configured to be in contact with external probes.

5. The display substrate according to claim 1, wherein the display region of the display substrate comprises a pixel electrode, and the at least one conductive pattern and the pixel electrode are at the same layer.

6. The display substrate according to claim 1, wherein the display region of the display substrate comprises a common electrode, and the at least one conductive pattern and the common electrode are at the same layer.

7. The display substrate according to claim 1, wherein the connection lines at a first side of the plurality of conductive line segments are on a first straight line, the connection lines at a second side of the plurality of conductive line segments opposite to the first side are on a second straight line, and the first straight line is in parallel to the second straight line.

8. The display substrate according to claim 1, wherein the wiring region comprises a plurality of sub wiring regions, the display substrate comprises a plurality of conductive patterns at the plurality of sub wiring regions respectively.

9. The display substrate according to claim 8, wherein two ends of the conductive patterns in an identical sub wiring region are at the same side of the identical sub wiring region.

10. The display substrate according to claim 8, wherein two ends of the conductive patterns in an identical sub wiring region are at two opposite sides of the identical sub wiring region.

11. The display substrate according to claim 8, wherein the conductive patterns at the plurality of sub wiring regions respectively are axisymmetric.

12. A method for forming a display substrate, wherein the display substrate comprises a base substrate, the base substrate comprises a display region and a non-display region at a periphery of the display region, and the non-display region comprises a wiring region, wherein the method comprises:
    forming a plurality of signal lines at the wiring region of the base substrate;
    forming an insulation layer covering the plurality of signal lines; and
    forming at least one conductive pattern on a surface of the insulation layer away from the signal lines, wherein each of the at least one conductive pattern comprises at least one conductive line segment, positions of the signal lines and positions of the at least one conductive line segment are in one-to-one correspondence, and an orthographic projection of each of the signal lines onto the base substrate is within an orthographic projection of a corresponding conductive line segment of the at least one conductive line segment onto the base substrate;
    wherein positions of the signal lines and positions of the at least one conductive line segment are in one-to-one correspondence,
    each of the signal lines is approximately parallel with the corresponding conductive line segment,
    the at least one conductive pattern each comprises a plurality of conductive line segments, the at least one conductive pattern each comprises a plurality of connection lines, the plurality of conductive line segments of each of the at least one conductive pattern are in parallel, and centers of the plurality of conductive line segments of each of the at least one conductive pattern are on the same straight line, and the plurality of conductive line segments of each of the at least one conductive pattern are connected end to end through the connection lines.

13. The method according to claim 12, further comprising: forming a transparent conductive film on a surface of the insulation layer away from the signal lines, and patterning the transparent conductive film to form the at least one conductive pattern and a pixel electrode at the display region.

14. The method according to claim 12, further comprising: forming a transparent conductive film on a surface of the insulation layer away from the signal lines, and patterning the transparent conductive film to form the at least one conductive pattern and a common electrode at the display region.

15. A method for detecting the display substrate according to claim 1, comprising:
    applying a voltage onto two ends of each of the at least one conductive pattern, to obtain a resistance of each of the at least one conductive pattern;
    in a case that the resistance of a conductive pattern of the at least one conductive pattern is smaller than a threshold, determining that the signal line at a position corresponding to the at least one conductive line segment of the conductive pattern is intact; or in a case that the resistance of a conductive pattern of the at least one conductive pattern is larger than a threshold, determining a broken conductive line segment of the conductive pattern, and detecting whether the signal line at a position corresponding to the broken conductive line segment is broken.

16. The method according to claim 15, wherein the non-display region further comprises a detection region, and two ends of each of the at least one conductive pattern are at the detection region, the method further comprises: enabling two probes to be in contact with the two ends of each of the at least one conductive pattern respectively, to apply a voltage onto the two ends of each of the at least one conductive pattern.

* * * * *